(12) United States Patent
Chen et al.

(10) Patent No.: US 8,878,308 B2
(45) Date of Patent: Nov. 4, 2014

(54) MULTI-FIN DEVICE BY SELF-ALIGNED CASTLE FIN FORMATION

(71) Applicant: Taiwan Semiconductor Manufacturing Company, LTD, Hsin-Chu (TW)

(72) Inventors: Hsin-Chih Chen, Tucheng (TW); Tsung-Lin Lee, Hsinchu (TW); Feng Yuan, Yonghe (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/724,709

(22) Filed: Dec. 21, 2012

(65) Prior Publication Data
US 2013/0113023 A1 May 9, 2013

Related U.S. Application Data

(62) Division of application No. 12/907,272, filed on Oct. 19, 2010, now Pat. No. 8,338,305.

(51) Int. Cl.
*H01L 27/088* (2006.01)
*H01L 29/772* (2006.01)
*H01L 29/66* (2006.01)
*H01L 21/308* (2006.01)
*H01L 29/78* (2006.01)

(52) U.S. Cl.
CPC ........ *H01L 29/772* (2013.01); *H01L 29/66795* (2013.01); *H01L 21/3086* (2013.01); *H01L 29/785* (2013.01)
USPC ................... 257/401; 257/368; 257/E29.022; 257/E29.04

(58) Field of Classification Search
CPC . H01L 21/3086; H01L 29/772; H01L 29/785; H01L 29/66795
USPC ...................... 257/368, 401, E29.022, E29.04
See application file for complete search history.

(56) References Cited

U.S. PATENT DOCUMENTS

| 2008/0157225 A1* | 7/2008 | Datta et al. ..................... 257/401 |
| 2009/0206374 A1* | 8/2009 | Anderson et al. .............. 257/270 |
| 2009/0278196 A1* | 11/2009 | Chang et al. ................... 257/328 |
| 2010/0264468 A1* | 10/2010 | Xu ................................. 257/288 |

* cited by examiner

*Primary Examiner* — Michelle Mandala
(74) *Attorney, Agent, or Firm* — Haynes and Boone, LLP

(57) ABSTRACT

The present disclosure provides a method includes forming a multi-fin device. The method includes forming a patterned mask layer on a semiconductor substrate. The patterned mask layer includes a first opening having a first width W1 and a second opening having a second width W2 less than the first width. The patterned mask layer defines a multi-fin device region and an inter-device region, wherein the inter-device region is aligned with the first opening; and the multi-fin device region includes at least one intra-device region being aligned with the second opening. The method further includes forming a material layer on the semiconductor substrate and the patterned mask layer, wherein the material layer substantially fills in the second opening; performing a first etching process self-aligned to remove the material layer within the first opening such that the semiconductor substrate within the first opening is exposed; performing a second etching process to etch the semiconductor substrate within the first opening, forming a first trench in the inter-device region; and thereafter performing a third etching process to remove the material layer in the second opening.

20 Claims, 14 Drawing Sheets

US 8,878,308 B2

MULTI-FIN DEVICE BY SELF-ALIGNED CASTLE FIN FORMATION

PRIORITY DATA

The present application is a divisional application of U.S. patent application Ser. No. 12/907,272, filed Oct. 19, 2010, now U.S. Pat. No. 8,338,305 issued Dec. 25, 2012, which is hereby incorporated by reference in its entirety.

BACKGROUND

Integrated circuits have progressed to advanced technologies with high packing densities and smaller feature sizes, such as 45 nm, 32 nm, 28 nm and 20 nm. In these advanced technologies, three dimensional transistors each having a multi-fin structure are often desired for enhanced device performance. However, existing methods and structures for such structures have various concerns and disadvantages associated with device quality and reliability. For example, various defects can be induced by merging an epitaxial (epi) feature. In another example, source and drain resistances are increased due to poor quality of merged source/drain epi features. In another example, the fabrication cost is higher due to additional process steps, such as the need for an additional mask to define an intra-device region. Therefore, there is a need for a new structure and method for a multi-fin device to address these concerns for enhanced performance and reduced fabrication cost.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
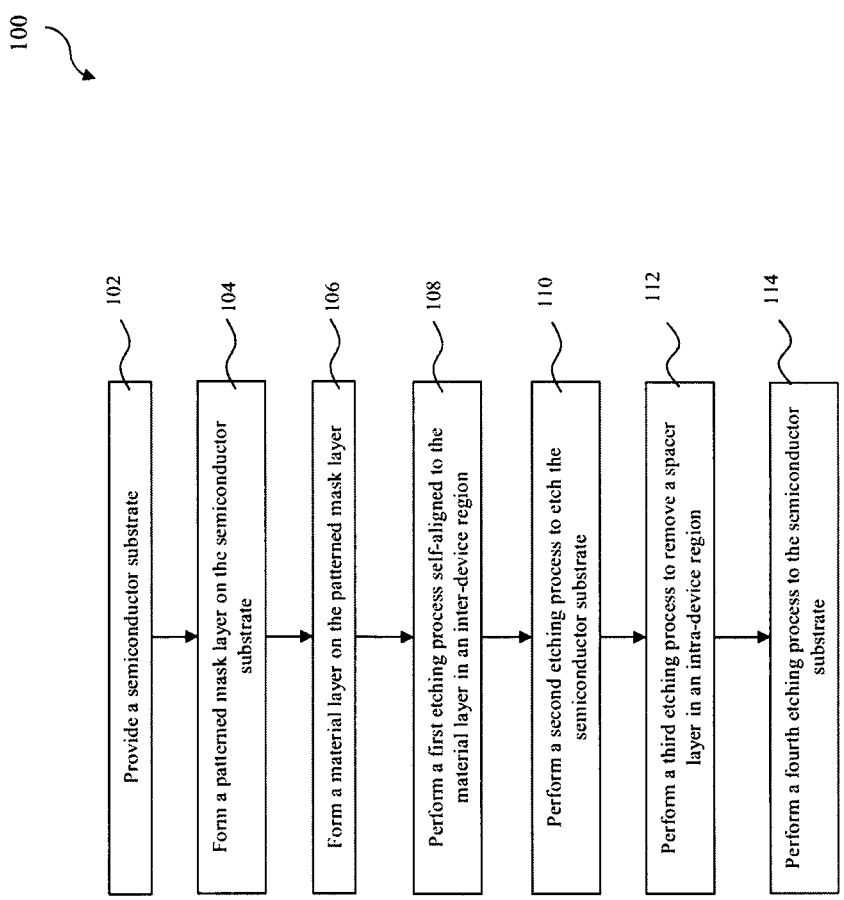
FIG. 1 is a flowchart of a method making a semiconductor device having a multi-fin structure constructed according to various aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 for making a semiconductor device constructed according to an embodiment of the present invention. The semiconductor device includes a multi-fin structure and a dual-depth isolation structure. FIGS. 2 through 7 are sectional views of an embodiment of a semiconductor structure 200 at various fabrication stages and constructed according to the method 100. The semiconductor structure 200 and the method 100 of making the same are collectively described with reference to FIGS. 1 through 7.

Figure 2:
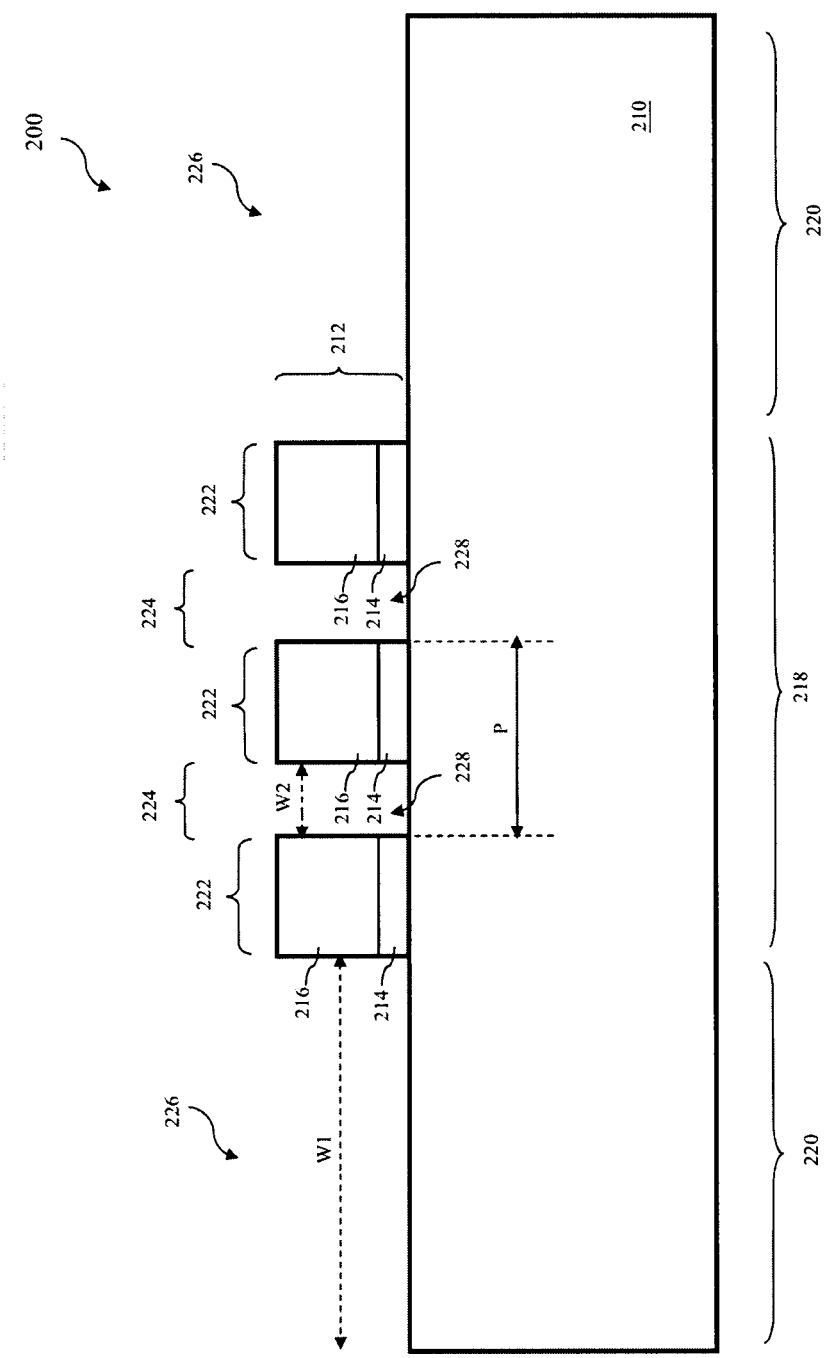
FIGS. 2-7 are sectional views of a semiconductor structure having a multi-fin structure at various fabrication stages constructed according to the method of FIG. 1.

Referring to FIGS. 1 and 2, the method 100 begins at step 102 by providing a semiconductor substrate 210. The semiconductor substrate 210 includes silicon. Alternatively, the substrate includes germanium, silicon germanium or other proper semiconductor materials. The semiconductor substrate 210 also includes various doped regions such as n-well and p-wells. In one embodiment, the semiconductor substrate 210 includes an epitaxy (or epi) semiconductor layer. In another embodiment, the semiconductor substrate 210 includes a buried dielectric material layer for isolation formed by a proper technology, such as a technology referred to as separation by implanted oxygen (SIMOX).

Still referring to FIGS. 1 and 2, the method 100 proceeds to step 104 by forming a patterned mask layer 212. In one embodiment, the patterned mask layer 212 is a hard mask layer having one or more suitable dielectric materials. For example, the mask layer 212 includes a silicon nitride (SiN) layer. In the present embodiment, the mask layer 212 includes a silicon oxide (SiO) layer 214 formed on the semiconductor substrate 210 and a SiN layer 216 formed on the SiO layer 214. In one example, the SiO layer 214 includes a thickness ranging between about 5 nm and about 15 nm. In another example, the SiN layer 216 includes a thickness ranging between about 40 nm and about 120 nm. In another embodiment, step 104 includes forming the SiO layer 214 by thermal oxidation and forming the SiN layer 216 by chemical vapor deposition (CVD). For example, the SiN layer 216 is formed by CVD using chemicals including Hexachlorodisilane (HCD or Si2Cl6), Dichlorosilane (DCS or SiH2Cl2), Bis (TertiaryButylAmino) Silane (BTBAS or C8H22N2Si) and Disilane (DS or Si2H6).

Step 104 further includes patterning the mask layer 212 by a procedure including a lithography patterning process and an etching process. In the present embodiment, a patterned photoresist layer is formed on the hard mask layer 212 using a photolithography process including photoresist coating, soft baking, exposing, post-exposure baking (PEB), developing, and hard baking. Then, the mask layer 212 is etched through the openings of the patterned photoresist layer, forming a patterned mask layer 212, by the etching process. The patterned photoresist layer is removed thereafter using a suitable process, such as wet stripping or plasma ashing. In one example, the etching process includes applying a dry (or plasma) etch to remove the mask layer 212 within the openings of the patterned photoresist layer. In another example, the etching process includes applying a plasma etch to remove the SiN layer 216 within the openings of the patterned photoresist layer, and a wet etch with a hydrofluoric acid (HF) solution to remove the SiO layer 214 within the openings. In another example, the etching process includes applying a plasma etch to remove the SiN layer 216 within the openings but the SiO layer 214 remains at this processing stage.

The patterned mask layer 212 includes multiple openings defining a multi-fin device region (or multi-fin region) 218 and one or more intra-device regions 220 in the semiconductor substrate 210. The multi-fin region 218 is configured for a multi-fin device, such as a multi-fin field-effect transistor (FET). In the present embodiment, the multi-fin device includes three exemplary fins. In a particular example, the multi-fin FET includes a metal-oxide-semiconductor (MOS) FET. The inter-device regions 220 are configured for isolation between two neighboring multi-fin transistors.

FIG. 2 illustrates one multi-fin device. Other multi-fin devices may present. For example, another multi-fin device is approximate the multi-fin device in the multi-fin region 218 from the left side and separated by the inter-device region 220 in the left side.

Further, the patterned mask layer 212 includes multiple features 222 within the multi-fin region 218. Each of the multiple features 222 defines a fin-like active region. The multiple features 222 are separated by intra-device regions 224, respectively. The intra-device regions 224 are designed for intra-device isolation between the fin-like active regions.

The patterned mask layer 212 includes a first openings 226 aligned with the inter-device regions 220 and a second openings 228 aligned with the intra-device regions 224. The first openings 226 (and the corresponding inter-device regions 220) each include a first width W1. The second openings 228 (and the corresponding intra-device regions 224) each include a second width W2. The first width W1 is substantially greater than the second width W2. In the present embodiment, the first width W1 is greater than about 200 nm and the second width W2 ranges between about 10 nm and about 30 nm. A pitch P of the multi-fin device is defined as a distance from a location of a fin to the same location of a neighboring fin. In the present embodiment, the pitch of the multi-fin device is less than about 80 nm.

Figure 3:
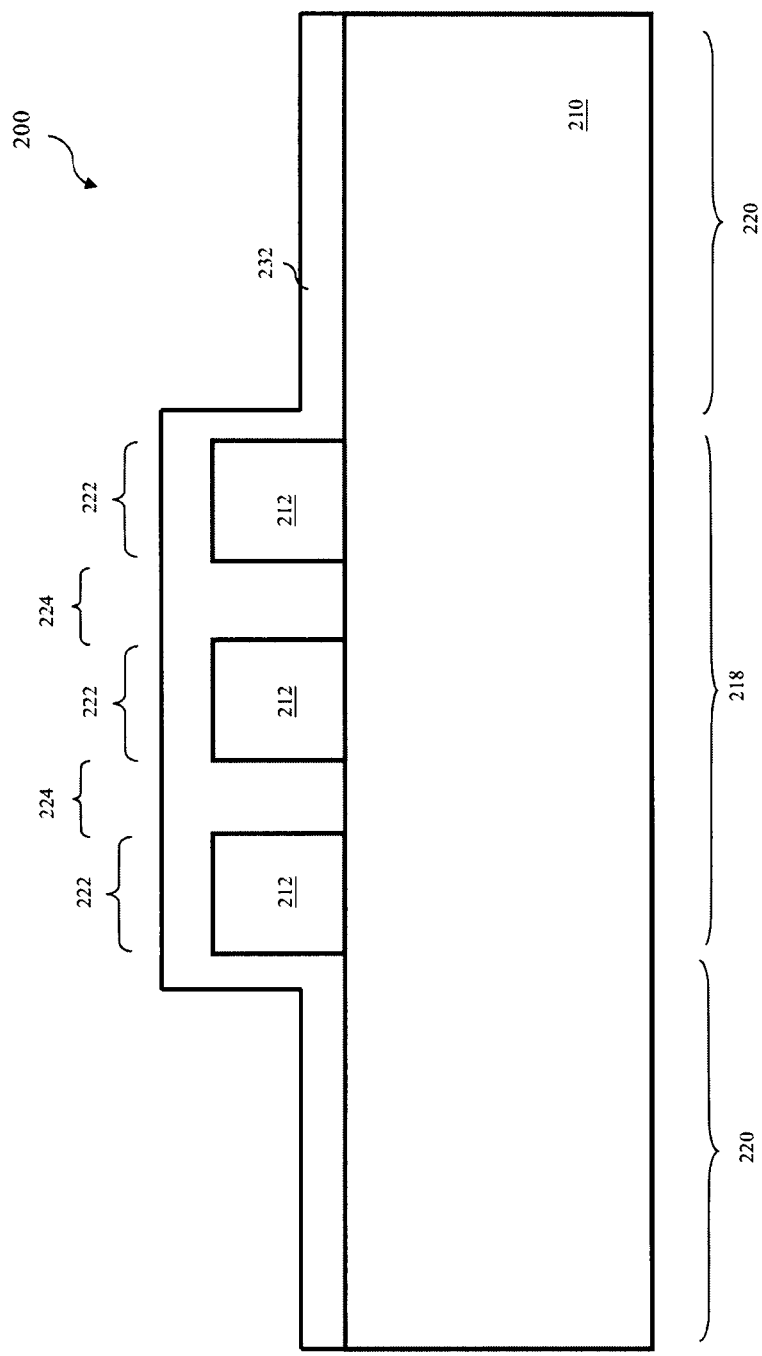

Referring to FIGS. 1 and 3, the method 100 proceeds to step 106 by forming a material layer 232 on the semiconductor substrate 210 and the patterned mask layer 212. The exemplary mask layers 214 and 216 are not shown here for simplicity. The thickness T of the material layer 232 is equal to or greater than half the second width W2, formulated as T=>W2/2, such that the material layer 232 substantially fills in the second openings 228. The thickness T of the material layer 232 is substantially less than half of the first width W1, formulated as T<W1/2, such that the first openings 226 is not substantially filled, as illustrated in FIG. 3. In the present embodiment, the thickness T is equal to or greater than about 5 nm if the second width is about the 10 nm or is equal to or greater than about 15 nm if the second width is about the 30 nm. The material layer 232 includes a dielectric material. In the present embodiment, the material layer 232 includes silicon oxide, formed by CVD or other suitable technology.

Figure 4:
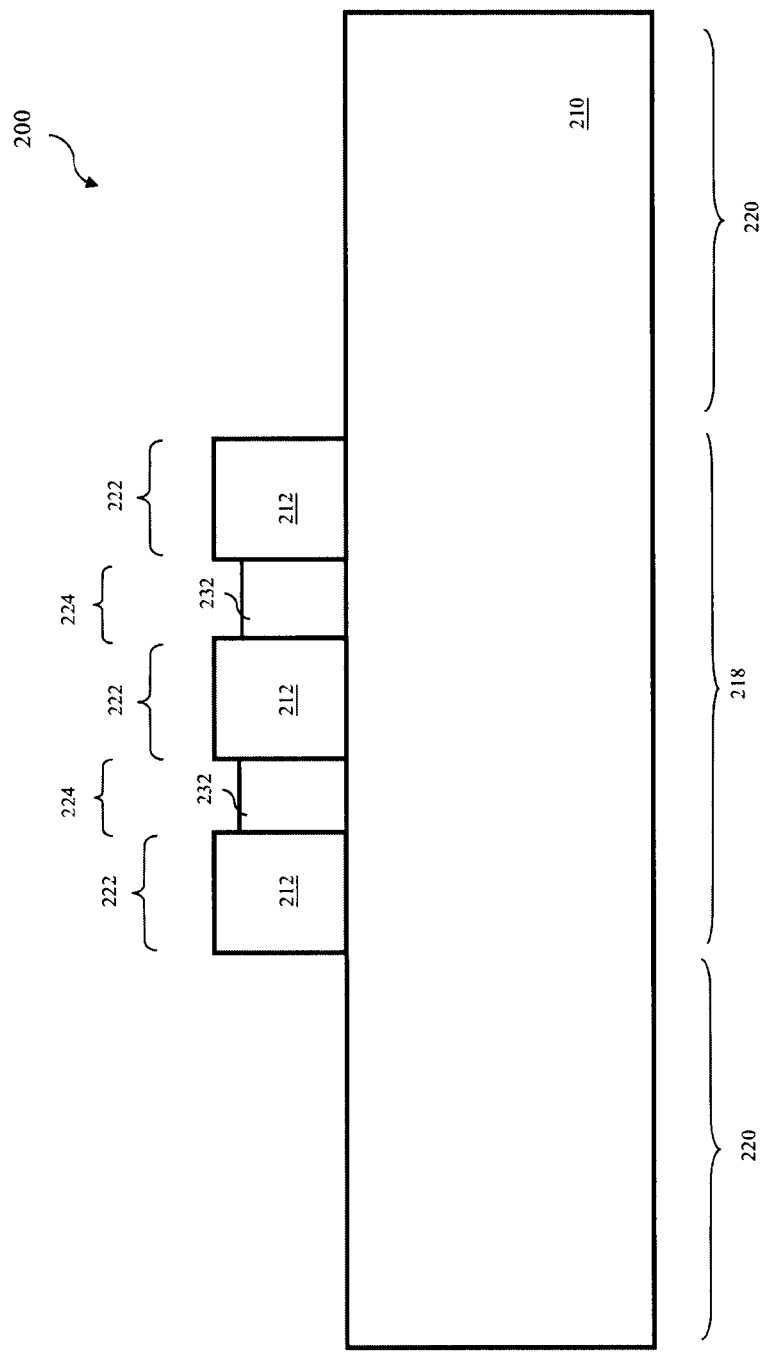

Referring to FIGS. 1 and 4, the method 100 proceeds to step 108 by performing a first etching process to the material layer 232. The material layer 232 within the first openings 226 is substantially removed by the first etching process such that the semiconductor substrate 210 within the first openings 220 is exposed. The material layer 232 on the multiple features 222 of the patterned mask layer 212 is substantially removed by the first etching process as well. However, only top portions of the material layer 232 within the second openings 228 are removed. The semiconductor substrate 210 within the second opening 228 is still covered by the remained portions of the material layer 232. In one embodiment, the first etching process implements a wet etch using an etch solution that effectively removes the material layer 232. In the present embodiment, the material layer 232 includes silicon oxide and the first etching process uses a HF solution to etch the material layer 232. If the SiO layer 214 of the mask layer 212 is not removed at step 104, then the first etching process collectively removes the SiO layer 214 and the material layer 232 within the first openings 226.

Under the relationships among the first width W1, second width W2 and the thickness T, the first etching process is aligned to completely remove the material layer 232 within the first openings 220. The material layer 232 is thus patterned to expose the semiconductor substrate 210 within the first openings 226. The material layer 232 is thus patterned by the first etching process self-aligned to the first openings 226 without using a lithography patterning process. Therefore, the first etching process is referred to as a self-aligned etching process. The fabrication cost is reduced and the defect issue is reduced as well.

Figure 5:
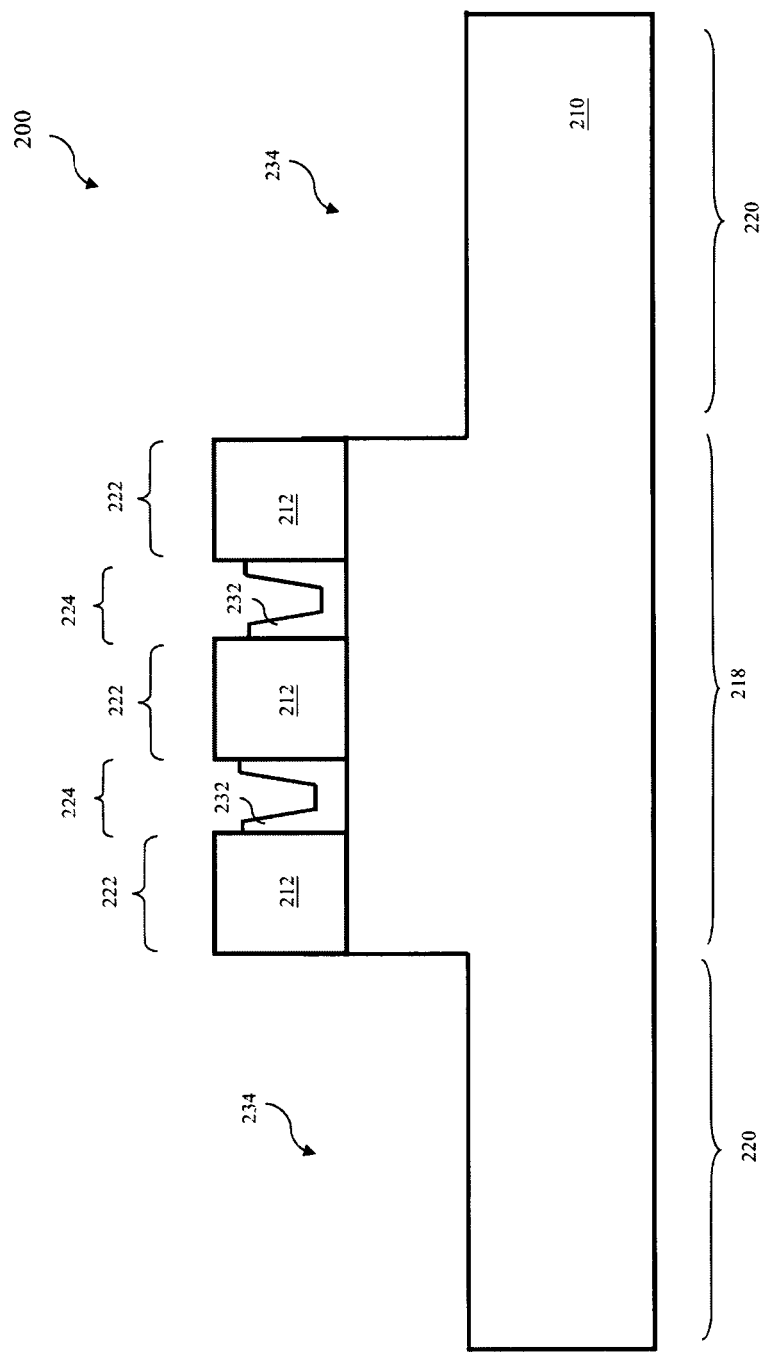

Referring to FIGS. 1 and 5, the method 100 proceeds to step 110 by performing a second etching process to the semiconductor substrate 210 using the material layer 232 and the mask layer 212 as an etch mask. The semiconductor substrate 210 within the first openings 226 is etched by the second etching process, forming first trenches 234 in the inter-device region 220 (and within the first openings 226) having a certain depth D0. In one embodiment, the depth D0 ranges between about 1000 angstrom and about 1400 angstrom.

In one embodiment, the second etching process implements a dry etch. For example, the etchant of the second etching process includes plasma HBr, Cl2, SF6, O2, Ar, and He. In another example, the etchant includes plasma CF4, C3F8, C4F8, CHF3, CH2F2, or a combination thereof.

Figure 6:
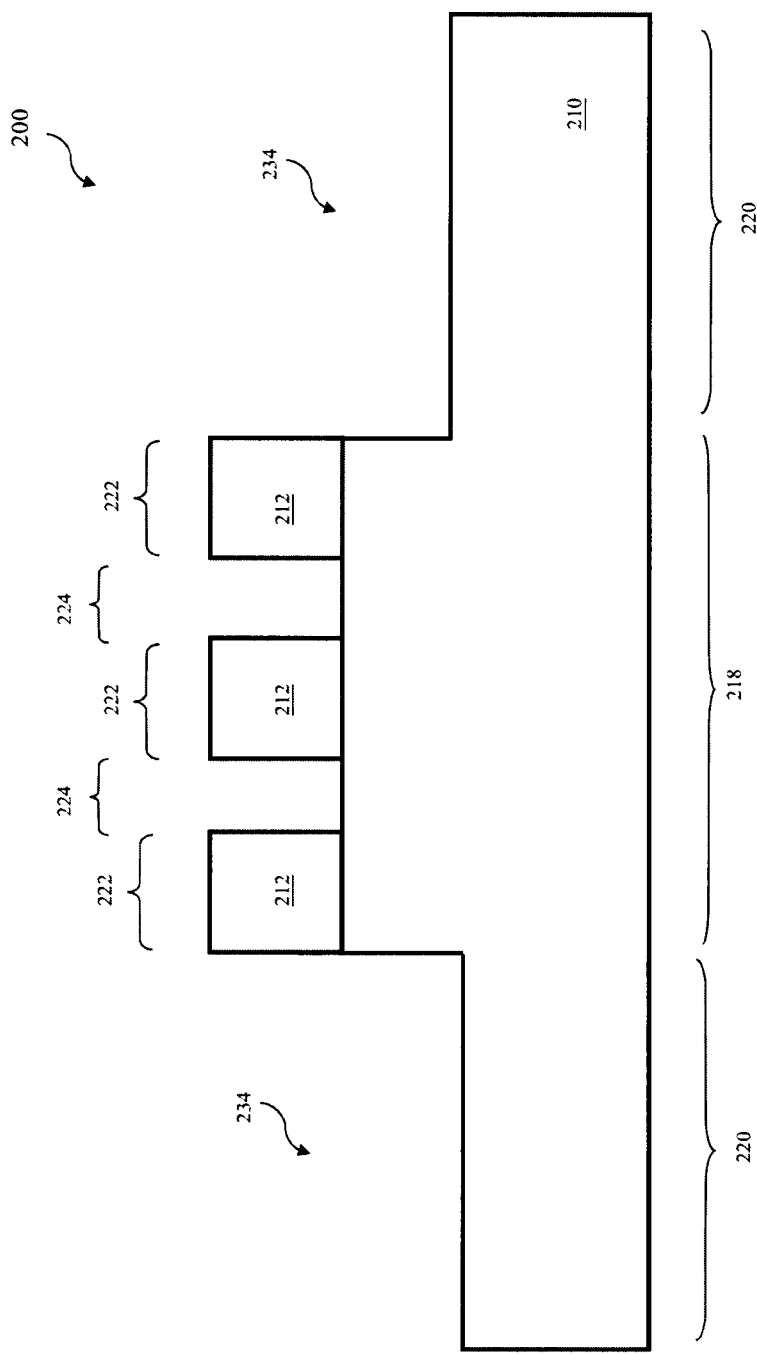

Referring to FIGS. 1 and 6, the method 100 proceeds to step 112 by performing a third etching process to the material layer 232. The third etching process removes the material layer 232, such as those within the second openings 228. In one embodiment, the third etching process implements a wet etch. In the present example, the material layer 232 includes silicon oxide and the third etching process uses a HF solution to remove the material layer 232. After the completion of the third etching process, the semiconductor substrate 210 within the first and openings are exposed.

Figure 7:
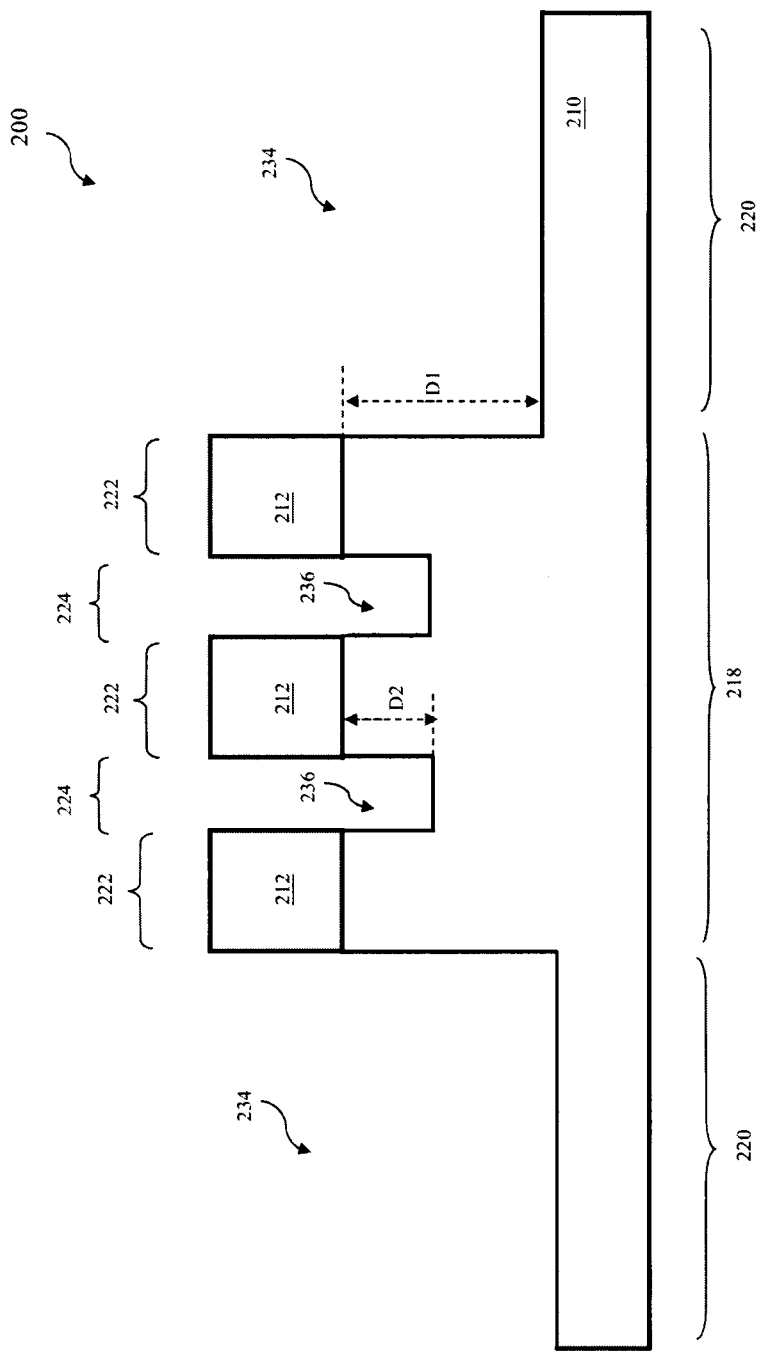

Referring to FIGS. 1 and 7, the method 100 proceeds to step 114 by performing a fourth etching process to the semiconductor substrate 210 using the mask layer 212 as an etch mask. The semiconductor substrate 210 within the first openings 226 is further etched by the fourth etching process. Thus the first trenches 234 in the inter-device region 220 are deeper and reach a first depth D1. The semiconductor substrate 210 within the second openings 228 is etched by the fourth etching process, forming second trenches 236 in the intra-device region 218 (and within the second openings 228) having a second depth D2 less than the first depth D1. In one embodiment, the first depth D1 ranges between about 1600 angstrom and about 2000 angstrom, and the second depth D2 ranges between about 400 angstrom and about 800 angstrom.

In one embodiment, the fourth etching process is similar to the second etching process. For example, the fourth etching process implements a dry etch. In one particular example, the etchant of the fourth etching process includes plasma HBr, Cl2, SF6, O2, Ar, and He. In another particular example, the etchant includes plasma CF4, C3F8, C4F8, CHF3, CH2F2, or a combination thereof.

Figure 8:
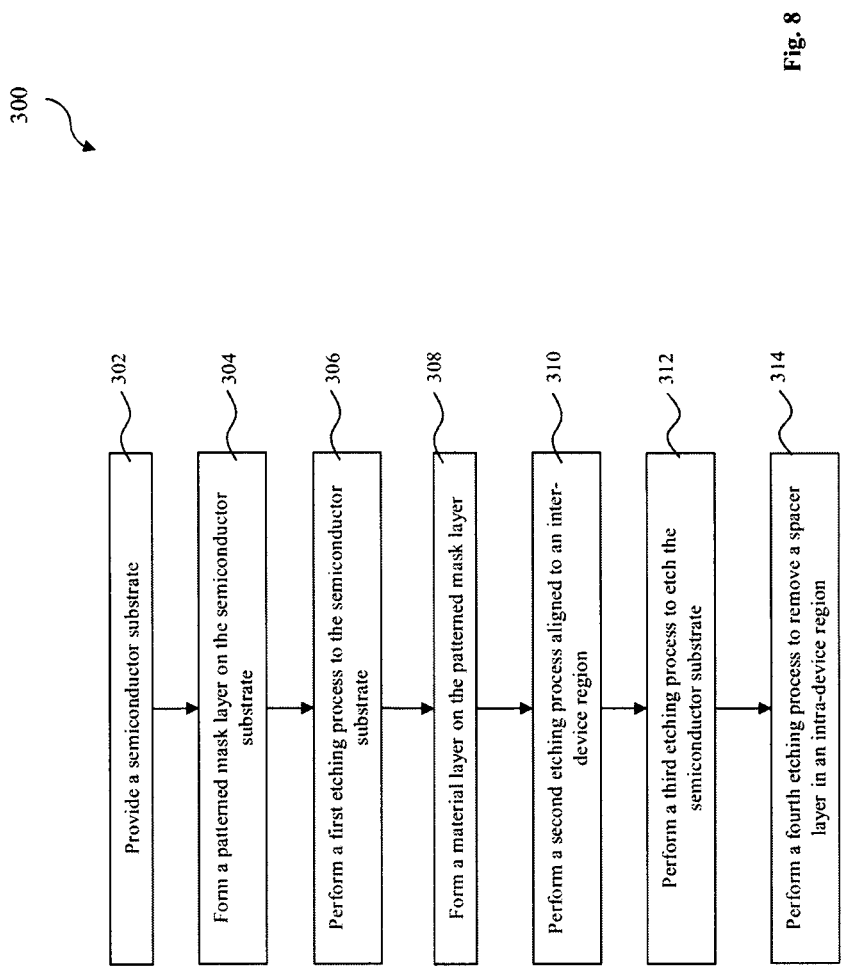
FIG. 8 is a flowchart of a method making a semiconductor device having a multi-fin structure constructed according to various aspects of the present disclosure in another embodiment.

FIG. 8 is a flowchart of a method 300 for making a semiconductor device constructed according to various aspects of the present disclosure in another embodiment. The semiconductor device includes a multi-fin structure and a dual-depth isolation structure. FIGS. 9 through 14 are sectional views of a semiconductor structure 400 at various fabrication stages and constructed according to other embodiments. The method 300 is similar to the method 100 of FIG. 1. However, the fourth etching process of FIG. 1 is implemented prior to the formation of the material layer 232 according to the present embodiment. The semiconductor structure 400 and the method 300 of making the same are collectively described with reference to FIGS. 8 through 14.

Figure 9:
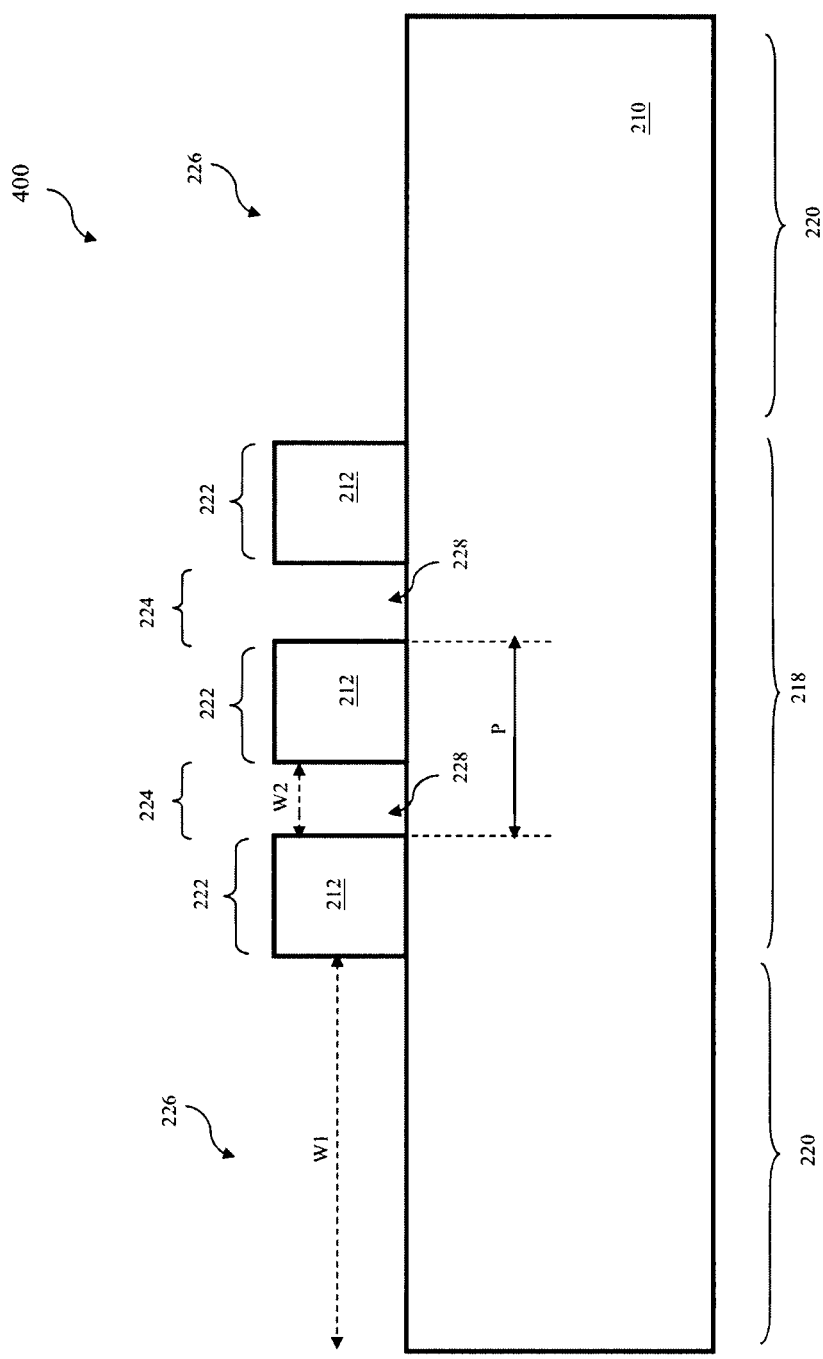
FIGS. 9-14 are sectional views of a semiconductor structure having a multi-fin structure at various fabrication stages constructed according to the method of FIG. 8.

Referring to FIGS. 8 and 9, the method 300 begins at step 302 by providing a semiconductor substrate 210. The semiconductor substrate 210 includes silicon. Alternatively, the substrate includes germanium, silicon germanium or other proper semiconductor materials. The semiconductor substrate 210 also includes various doped regions such as n-well and p-wells. In one embodiment, the semiconductor substrate 210 includes an epi semiconductor layer. In another embodiment, the semiconductor substrate 210 includes a buried dielectric material layer for isolation formed by a proper technology.

Still referring to FIGS. 8 and 9, the method 300 proceeds to step 304 by forming a patterned mask layer 212. In one embodiment, the patterned mask layer 212 is a hard mask layer having one or more suitable dielectric materials. In the present embodiment, the mask layer 212 includes a SiO layer 214 formed on the semiconductor substrate 210 and a SiN layer 216 formed on the SiO layer 214 (not shown for simplicity). In one example, the SiO layer 214 includes a thickness ranging between about 5 nm and about 15 nm. In another example, the SiN layer 216 includes a thickness ranging between about 40 nm and about 120 nm. In another embodiment, step 104 includes forming the SiO layer 214 by thermal oxidation and forming the SiN layer 216 by chemical vapor deposition (CVD).

Step 104 further includes patterning the mask layer 212 by a procedure including a lithography patterning process and an etching process. In the present embodiment, a patterned photoresist layer is formed on the hard mask layer 212 using a photolithography process. Then, the mask layer 212 is etched through the openings of the patterned photoresist layer, forming a patterned mask layer 212, by the etching process. The patterned photoresist layer is removed thereafter using a suitable process, such as wet stripping or plasma ashing. In one example, the etching process includes applying a dry etch to remove the mask layer 212 within the openings of the patterned photoresist layer. In another example, the etching process includes applying a plasma etch to remove the SiN layer 216 within the openings of the patterned photoresist layer, and a wet etch with a HF solution to remove the SiO layer 214 within the openings.

The patterned mask layer 212 includes multiple openings defining a multi-fin device region (or multi-fin region) 218 and one or more intra-device regions 220 in the semiconductor substrate 210. The multi-fin region 218 is configured for a multi-fin device, such as a multi-fin FET. In the present embodiment, the multi-fin device includes three exemplary fins. In a particular example, the multi-fin FET includes a MOS FET. The inter-device regions 220 are configured for isolation between two neighboring multi-fin transistors.

Further, the patterned mask layer 212 includes multiple features 222 within the multi-fin region 218. Each of the multiple features 222 defines a fin-like active region. The multiple features 222 are separated by intra-device regions 224, respectively. The intra-device regions 224 are designed for intra-device isolation between the fin-like active regions.

The patterned mask layer 212 includes a first openings 226 aligned with the inter-device regions 220 and a second openings 228 aligned with the intra-device regions 224. The first openings 226 (and the corresponding inter-device regions 220) each include a first width W1. The second openings 228 (and the corresponding intra-device regions 224) each include a second width W2. The first width W1 is substantially greater than the second width W2. In the present embodiment, the first width W1 is greater than about 200 nm and the second width W2 ranges between about 10 nm and about 30 nm. A pitch P of the multi-fin device is defined as a distance from a location of a fin to the same location of a neighboring fin. In the present embodiment, the pitch of the multi-fin device is less than about 80 nm.

Figure 10:
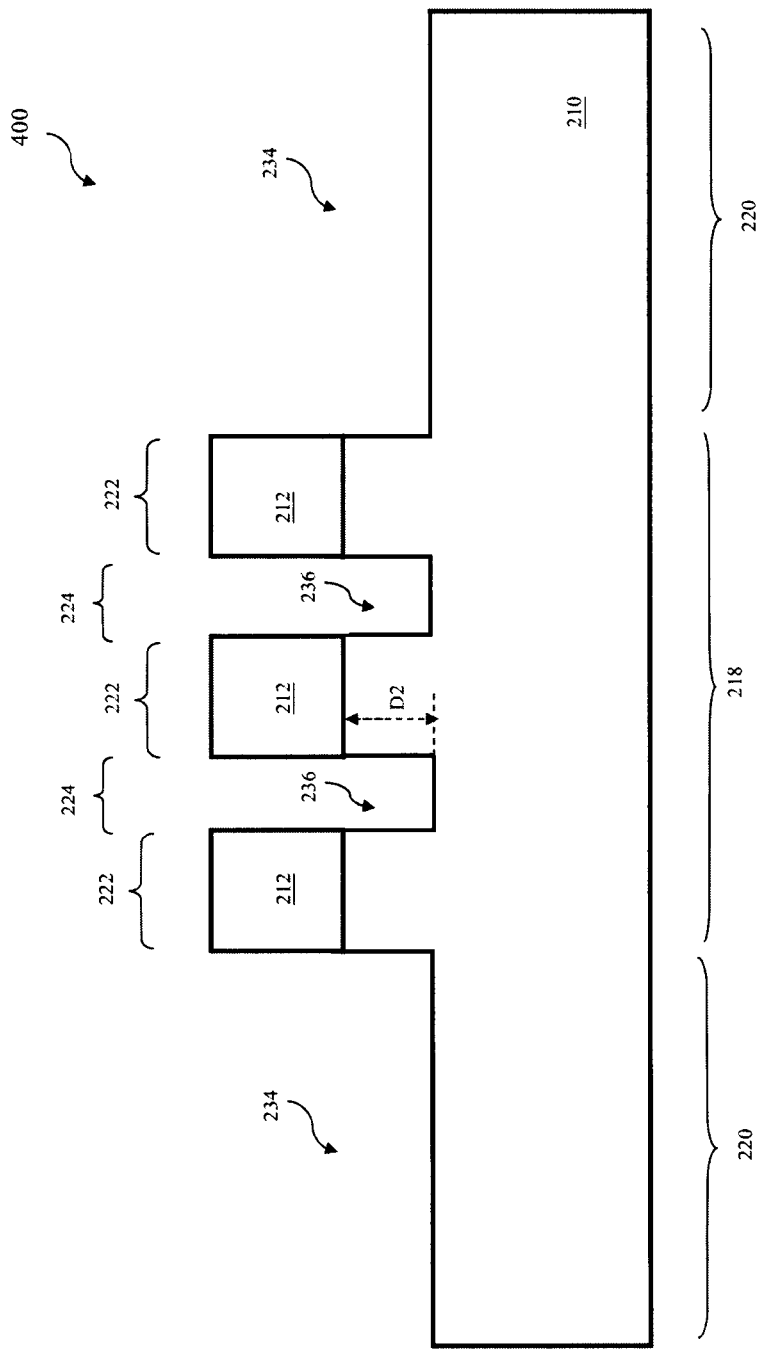

Referring to FIGS. 8 and 10, the method 300 proceeds to step 306 by performing a firth etching process to the semiconductor substrate 210 using the mask layer 212 as an etch mask. The semiconductor substrate 210 within the first openings 226 and the second openings 228 is etched by the first etching process, forming first trenches 234 and second trenches 236, as illustrated in FIG. 10. The first trenches 234 are within the inter-device region 220. The second trenches 234 are within the intra-device region 224. The first and second trenches now have the second depth D2. In one embodiment, the second depth D2 ranges between about 400 angstrom and about 800 angstrom.

In one embodiment, the first etching process is similar to the fourth etching process of FIG. 1. For example, the fourth etching process implements a dry etch. In one particular example, the etchant of the fourth etching process includes plasma HBr, Cl2, SF6, O2, Ar, and He. In another particular example, the etchant includes plasma CF4, C3F8, C4F8, CHF3, CH2F2, or a combination thereof.

Figure 11:
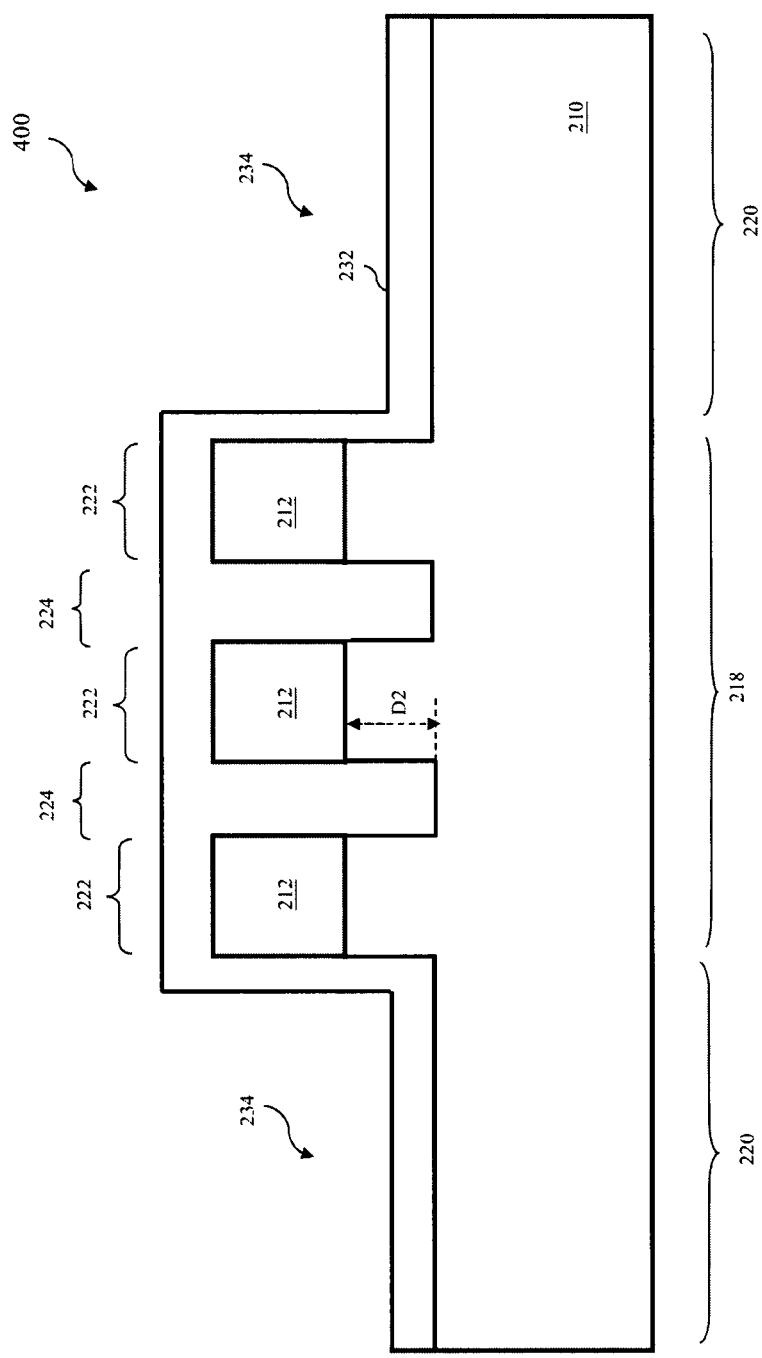

Referring to FIGS. 8 and 11, the method 300 proceeds to step 308 by forming a material layer 232 on the semiconductor substrate 210 and the patterned mask layer 212. The thickness T of the material layer 232 is equal to or greater than half the second width W2, formulated as T=>W2/2, such that the material layer 232 substantially fills in the second openings 228. The thickness T of the material layer 232 is substantially less than half of the first width W1, formulated as T<W1/2, such that the first openings 226 is not substantially filled the first trenches, as illustrated in FIG. 11. In the present embodiment, the thickness T is equal to or greater than about 5 nm if the second width is about the 10 nm or is equal to or greater than about 15 nm if the second width is about the 30 nm. The material layer 232 includes a dielectric material. In the present embodiment, the material layer 232 includes silicon oxide, formed by CVD or other suitable technology.

Figure 12:
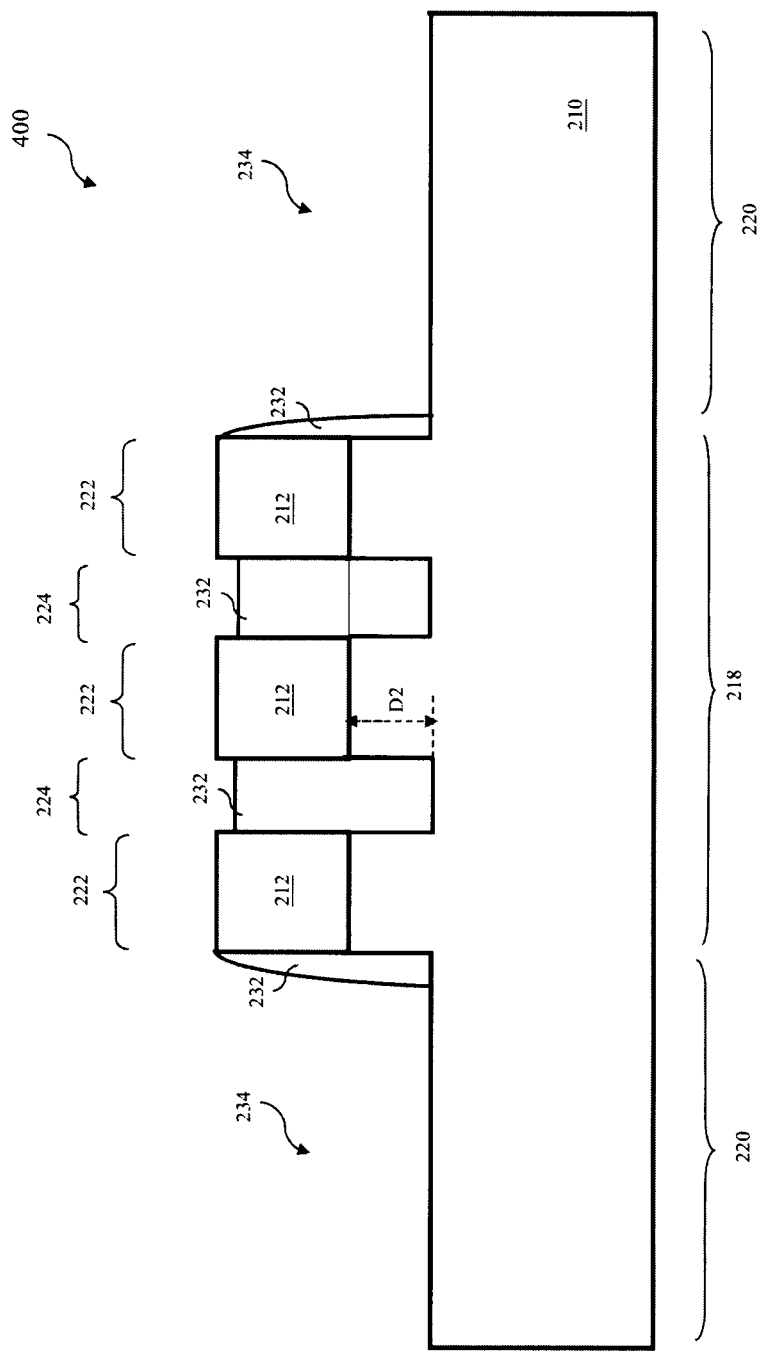

Referring to FIGS. 8 and 12, the method 300 proceeds to step 310 by performing a second etching process to the material layer 232. The material layer 232 within the first trenches 234 is substantially removed by the second etching process such that the semiconductor substrate 210 within the first openings 220 is exposed. The material layer 232 on the multiple features 222 of the patterned mask layer 212 is substantially removed by the second etching process as well. However, only top portions of the material layer 232 within the second openings 228 are removed. The semiconductor substrate 210 within the second opening 228 is still covered by the remained portions of the material layer 232. In one embodiment, the second etching process implements a wet etch using an etch solution that effectively removes the material layer 232. In another embodiment, the second etching process includes a dry etch. In the present embodiment, the second etching process implements a dry etch to the material layer 232, resulting in spacers of the material layer 232 formed on the side of the first trenches 234.

Under the relationships among the first width W1, second width W2 and the thickness T, the second etching process is aligned to completely remove the material layer 232 within the first trenches 234. The material layer 232 is thus patterned to expose the semiconductor substrate 210 within the first openings 226. The material layer 232 is thus patterned by the second etching process self-aligned to the first openings 226 without using a lithography patterning process. Therefore, the second etching process is referred to as a self-aligned etching process. The fabrication cost is reduced accordingly.

Figure 13:
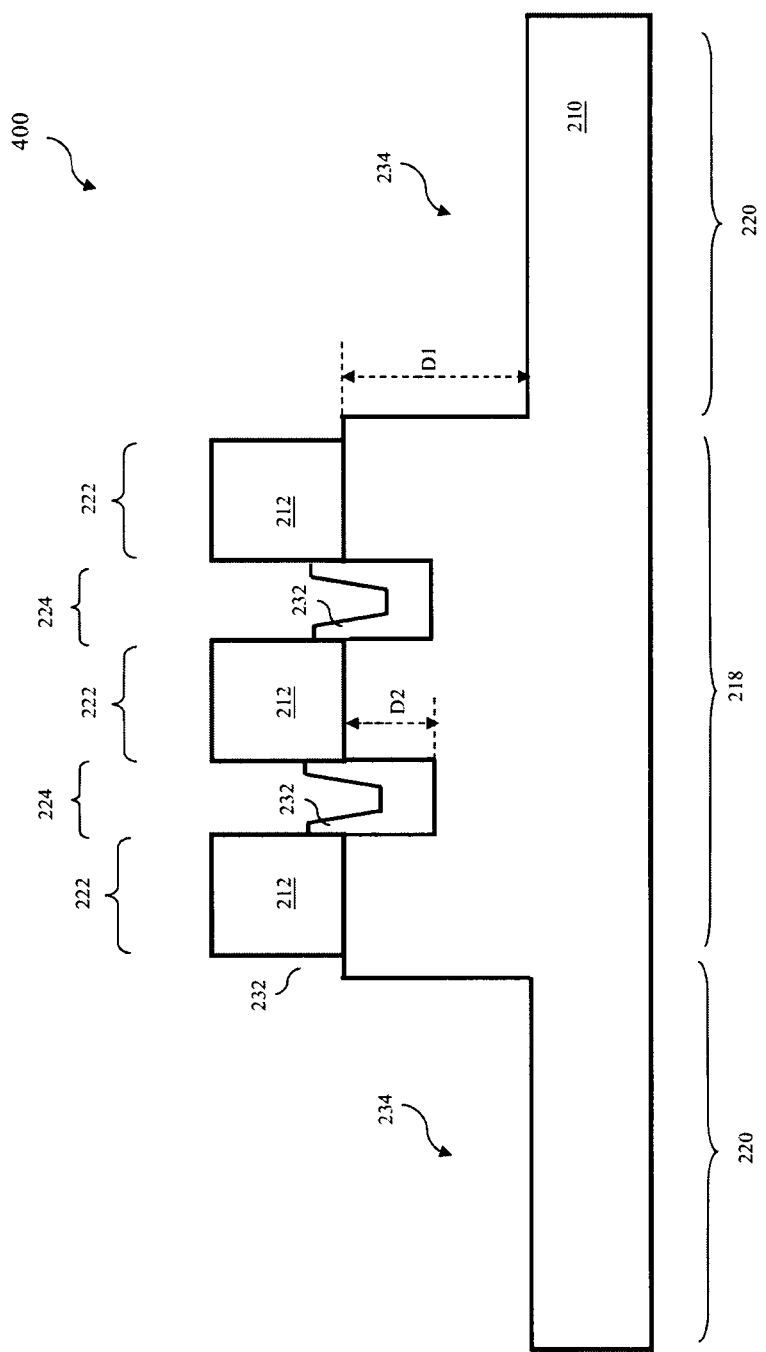

Referring to FIGS. 8 and 13, the method 300 proceeds to step 312 by performing a third etching process to the semiconductor substrate 210 using the material layer 232 and the mask layer 212 as an etch mask. The third etching process is similar to the second etching process of FIG. 1. The semiconductor substrate 210 within the first openings 226 is further etched by the third etching process. The first trenches 234 in the inter-device region 220 (and within the first openings 226) now have the first depth D1. In one embodiment, the depth D1 ranges between about 1400 angstrom and about 2000 angstrom. In the present embodiment, a step-wise sidewall may be formed in the first trenches 234.

In one embodiment, the second etching process implements a dry etch. For example, the etchant of the second etching process includes plasma HBr, Cl2, SF6, O2, Ar, and He. In another example, the etchant includes plasma CF4, C3F8, C4F8, CHF3, CH2F2, or a combination thereof.

Figure 14:
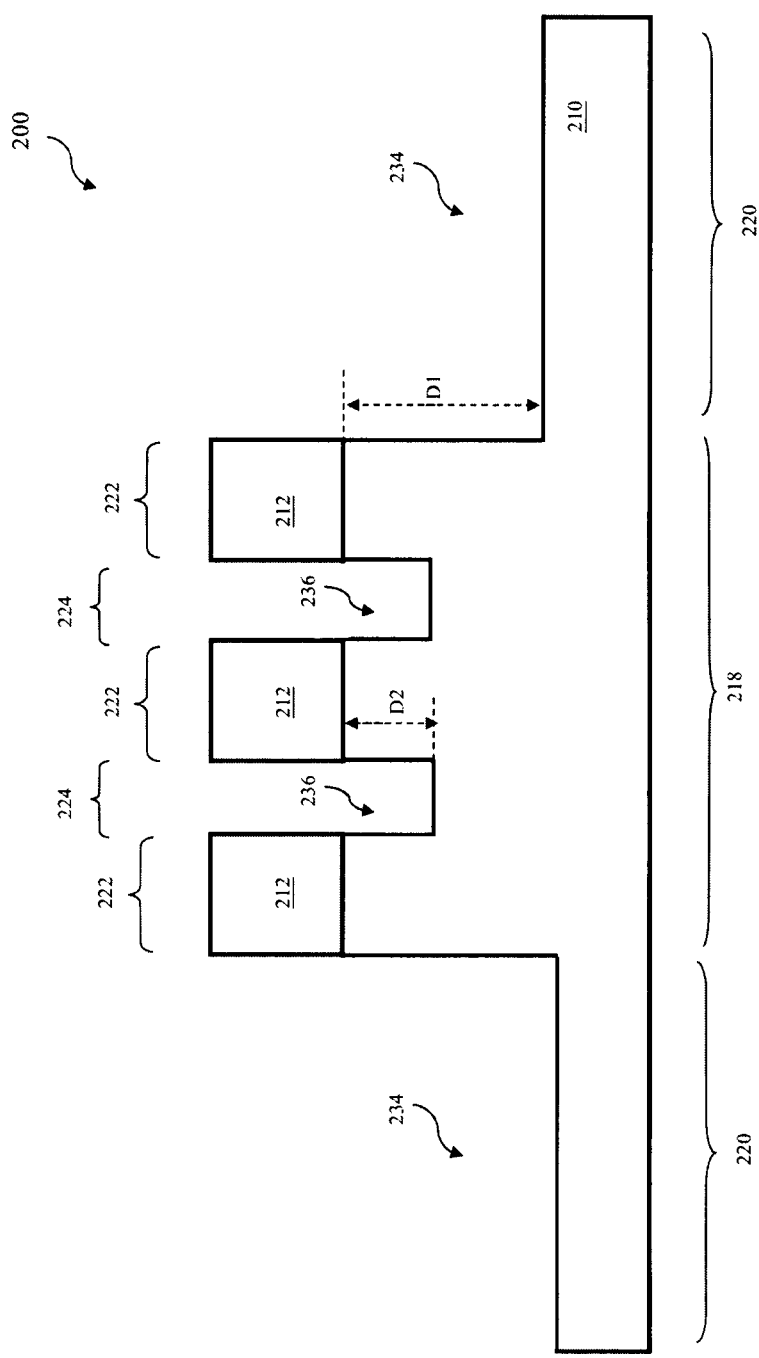

Referring to FIGS. 8 and 14, the method 300 proceeds to step 314 by performing a fourth etching process to the material layer 232. The fourth etching process is similar to the third etching process of FIG. 1. The fourth etching process removes the material layer 232, such as those within the intra-device regions 224. In one embodiment, the fourth etching process implements a wet etch. In the present example, the material layer 232 includes silicon oxide and the fourth etching process uses a HF solution to remove the material layer 232. After the completion of the fourth etching process, the first trenches 234 have the first depth D1 and the second trenches 236 have the second depth D2 less than the first depth D1. In one embodiment, the first depth D1 ranges between about 1600 angstrom and about 2000 angstrom, and the second depth D2 ranges between about 400 angstrom and about 800 angstrom.

Other processing steps may be implemented subsequently. In one embodiment, a dielectric material layer is partially filled in the first trenches 234 and the second trenches 236, forming first shallow trench isolation (STI) features in the inter-device regions 220 and second STI features in the intra-device regions 224. The formation of various STI features includes filling the trenches by one or more dielectric materials such as silicon oxide, silicon nitride, or silicon oxynitride. The filled trench may have a multi-layer structure such as a thermal oxide liner layer with silicon nitride filling the trench. In one embodiment, filling various STI features includes growing a thermal oxide trench liner to improve the trench interface, filling the trench with silicon oxide or silicon nitride using a CVD technology, and optionally performing an thermal annealing.

In another embodiment, the method 100 further includes an etch step to remove the patterned mask layer 212 by a suitable etching process. In one example when the mask layer 212 having the SiO layer 214 and the SiN layer 216, the etch step includes a hot phosphoric acid (H3PO4) solution to remove silicon nitride. In another embodiment, the first etching process additionally includes a HF solution to remove silicon oxide after the H3PO4 solution is applied.

In yet another embodiment, the method 100 further includes forming epi semiconductor layer on the active regions within the multi-fin device region 218 using an epi growth technology. In one example, the epi semiconductor layer includes a semiconductor material different from the semiconductor material of the semiconductor substrate 201.

In an alternative embodiment, the trenches 234 and 236 are completely filled with one or more dielectric materials. Then the semiconductor material of the active regions within the multi-fin device region 218 is etched back. Thereafter, an epi growth is performed to form multi-fin semiconductor features within the multi-fin device region 218. In furtherance of this alternative embodiment, the processing steps includes filling the trenches by one or more dielectric materials (such as silicon oxide, silicon nitride, or silicon oxynitride); performing a chemical mechanical planarization (CMP) process to remove the excessive dielectric material(s) and planarize the substrate surface; etching back the semiconductor material of the active areas within the multi-fin device region 218; and performing an epi growth to form one or more multi-fin semiconductor features within the multi-fin device region 218.

In another embodiment, the method 100 includes a procedure to form a gate stack over the multiple fin-like active regions. The gate stack includes a gate dielectric material layer and a gate electrode disposed on the gate dielectric material layer. The gate dielectric layer includes silicon oxide, high k dielectric material or combinations thereof. The gate electrode includes polysilicon, metal, other conductive material with proper work functions (for n-type FET and p-type FET, respectively), and combinations thereof. The formation of gate stack includes deposition steps, lithography patterning step and etching step. The gate stack is configured perpendicular to the multiple fin-like active regions.

In another embodiment, the method 100 includes another procedure to form source and drain regions in the multi-fin device region 218. In one example, the source and drain regions include light doped drain (LDD) regions and heavily doped source and drain (S/D) features, collectively referred to as source and drain regions, formed by various ion implantation processes. When the multi-fin device region 218 includes both n-type FETs (nFETs) and p-type FETs (pFETs), the source and drain regions are formed for the n-type FETs and the p-type FETs, respectively, using proper doping species. As one example for nFETs, the LDD features are formed by an ion implantation with a light doping dose. Thereafter, spacers are formed by dielectric deposition and anisotropic etch, such as plasma etch. Then the heavily doped S/D features are formed by an ion implantation with a heavy doping dose. The various source and drain features of the pFETs can be formed in a similar procedure but with opposite doping type. In one embodiment of the procedure to form various source and drain features for both nFETs and pFETs, the LDD features of nFETs are formed by an ion implantation while the regions of pFETs are covered by a patterned photoresist layer; the LDD features of pFETs are formed by an ion implantation while the regions of nFETs; then spacers are formed to nFET gate stacks and pFET gate stacks by deposition and etch. the S/D features of nFETs are formed by ion implantation while the regions of pFETs are covered by another patterned photoresist layer; and the S/D features of pFETs are formed by ion implantation while the regions of nFETs are covered by another patterned photoresist layer. In one embodiment, a high temperature annealing process is followed to activate the various doping species in the source and drain regions.

In yet another embodiment, an inter-level dielectric (ILD) layer is formed on the semiconductor substrate 210. The ILD layer includes silicon oxide, low k dielectric material, other suitable dielectric materials, or combinations thereof. The ILD layer is formed by a suitable technique, such as CVD. For example, a high density plasma CVD can be implemented to form the ILD layer.

In yet another embodiments, the method 100 further includes a procedure to form various interconnection features designed to couple various devices (including various multi-fin devices) to form functional circuits. The interconnection features include vertical interconnects, such as contacts and vias, and horizontal interconnects, such as metal lines. The various interconnection features may use various conductive materials including copper, tungsten and silicide. In one example, a damascene process is used to form copper-based multilayer interconnection structure. In another embodiment, tungsten is used to form tungsten plug in the contact holes. In another example, silicide is used to form various contact on source and drain regions for reduced contact resistance.

In another embodiment, a pFET has a strained structure for enhanced carrier mobility and improved device performance. In furtherance of the embodiment, silicon germanium (SiGe) is formed in the source and drain regions of the pFET to achieve a proper stress effect. In another embodiment, an nFET has a strained structure for enhanced carrier mobility and improved device performance. In furtherance of the embodiment, silicon carbide (SiC) is formed in the source and drain regions of the nFET to achieve a proper stress effect.

The present disclosure can be used in various applications where multi-fin devices are incorporated for enhanced performance. For example, the multi-fin devices can be used to form static random access memory (SRAM) cells. In other examples, the multi-fin devices can be incorporated in various integrated circuit, such as logic circuit, dynamic random access memory (DRAM), flash memory, or imaging sensor.

Thus, the present disclosure provides a method of forming a multi-fin device. The method includes forming, on a semiconductor substrate, a patterned mask layer that includes a first opening having a first width W1 and a second opening having a second width W2 less than the first width, and defines a multi-fin device region and an inter-device region. The inter-device region is aligned with the first opening. The multi-fin device region includes at least one intra-device region being aligned with the second opening. The method further includes forming a material layer on the semiconductor substrate and the patterned mask layer, wherein the material layer substantially fills in the second opening; performing a first etching process self-aligned to remove the material layer within the first opening such that the semiconductor substrate within the first opening is exposed; performing a second etching process to etch the semiconductor substrate within the first opening, forming a first trench in the inter-device region; and thereafter performing a third etching process to remove the material layer in the second opening.

In one embodiment, the forming of the material layer includes forming the material layer having a thickness T that satisfies $W1 > 2*T >= W2$. In another embodiment, the method further includes performing a fourth etching process to etch the semiconductor substrate in the first and second openings, forming a second trench in the intra-device region. In one embodiment, the fourth etching process is implemented after the third etching process. In an alternative embodiment, the fourth etching process is implemented before the forming of the material layer. The first trench has a first depth D1 and the second trench has a second depth D2 substantially less than the first depth D1. In another embodiment, the fourth etching process includes a dry etching process. In other embodiments, the forming of the material layer includes implementing a chemical vapor deposition (CVD) process to form a silicon oxide layer; and the forming of the patterned mask layer includes forming a silicon nitride layer using another CVD process. In yet other embodiments, the second etching process includes a dry etching process; and the third etching process includes a wet etching process. The first etching process removes only top portion of the material layer within the second opening.

The present disclosure also provides another embodiment of a method of forming a multi-fin device. The method includes forming a patterned mask layer on a semiconductor substrate, wherein the patterned mask layer includes a first opening having a first width W1 and a second opening having a second width W2 less than the first width W1; forming a material layer on the semiconductor substrate and the patterned mask layer, wherein the material layer has a thickness T satisfying $W1 > 2*T >= W2$ and substantially fills in the second opening; performing a first etching process self-aligned to remove the material layer within the first opening such that the semiconductor substrate within the first opening is exposed; performing a second etching process to etch the semiconductor substrate within the first opening using the patterned mask layer and the material layer as an etch mask; and performing a third etching process to remove the material layer in the second opening.

The patterned mask layer defines a multi-fin device region and an inter-device region. The inter-device region is aligned with the first opening; and the multi-fin device region includes at least one intra-device region being aligned with the second opening. In one embodiment, the method further includes performing a fourth etching process to the semiconductor substrate within the first and second openings, wherein the second and fourth etching processes form a first trench and a second trench of the semiconductor substrate, wherein the first trench is aligned with the first opening and has a first depth D1, and the second trench is aligned with the second opening and has a second depth D2 less than the first depth D1. In other embodiments, the performing of the second etching process implements a dry etching process to the semiconductor substrate within the first opening; and the performing of the fourth etching process implements another dry etching process to the semiconductor substrate within the first opening and the second opening. In another embodiment, the fourth etching process is implemented before the forming of the material layer. In an alternative embodiment, the fourth etching process is implemented after the performing of the third etching process. In yet another embodiment, the patterned mask layer includes a thermal silicon oxide layer and a silicon nitride layer on the thermal silicon oxide layer. In yet another embodiment, the forming of the material layer includes implementing a chemical vapor deposition (CVD) process to form a silicon oxide layer. In yet another embodiment, the method further includes forming a multi-fin field-effect transistor in the multi-fin device region.

The present disclosure also provide one embodiment of a multi-fin device. The multi-fin device includes a multi-fin transistor formed on a semiconductor substrate, wherein the multi-fin transistor includes at least two fin-like active regions; an inter-device isolation feature formed in the semiconductor substrate, adjacent the multi-fin transistor, and having a first width W1 and a first depth D1; and an intra-device isolation feature formed in the semiconductor substrate, disposed between the two fin-like active regions, and having a second width W2 less than W1 and a second depth D2 less than D1.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A multi-fin device, comprising:
a multi-fin transistor formed on a semiconductor substrate, wherein the multi-fin transistor includes a first fin active region and a second fin active region;
an inter-device isolation feature formed in the semiconductor substrate, adjacent the multi-fin transistor, and having a first width W1 and a first depth D1; and
an intra-device isolation feature formed in the semiconductor substrate and extending continuously from the first fin active region to the second fin active region, wherein the entire intra-device isolation feature has a second width W2 different from W1 and a second depth D2 different from D1, wherein the first depth D1 is at least two times greater than the second depth D2.

2. The multi-fin device of claim 1, wherein the first depth D1 ranges between about 1600 angstrom and about 2000 angstrom and the second depth D2 ranges between about 400 angstrom and about 800 angstrom.

3. The multi-fin device of claim 1, wherein the first width W1 is greater than about 200 nm and the second width W2 ranges between about 10 nm and about 30 nm.

4. The multi-fin device of claim 1, wherein the multi-fin transistor further includes a third fin active region, wherein the second fin active region is disposed between the first fin active region and the third fin active region.

5. The multi-fin device of claim 4, further comprising another intra-device isolation feature formed in the semiconductor substrate and disposed between the second fin active region and the third fin active region, and
wherein the intra-device isolation feature is disposed between the first in active region and the second fin active region.

6. The multi-fin device of claim 5, wherein the another intra-device isolation feature has the second width W2 and the second depth D2.

7. The multi-fin device of claim 1, further comprising another inter-device isolation feature formed in the semiconductor substrate adjacent the multi-fin transistor.

8. The multi-fin device of claim 7, wherein the another inter-device isolation features is adjacent a first side of the multi-fin transistor and the inter-device isolation features is adjacent a second side of the multi-fin transistor, the first side of the multi-fin transistor being opposed by the second side of the multi-fin transistor.

9. A device comprising:
a multi-fin transistor formed on a semiconductor substrate, wherein the multi-fin transistor includes a first fin active region and a second fin active region;
a first isolation region formed in the semiconductor substrate on a first side of the multi-fin transistor, the first isolation region having a first depth D1;
a second isolation region formed in the semiconductor substrate on a second side of the multi-fin transistor, the second isolation region having the first depth D1; and
a third isolation region formed in the semiconductor substrate and extending continuously from the first fin active region to the second fin active region, the entire third isolation region having a second depth D2 that is different than the first depth D1, wherein the first depth D1 is at least two times greater than the second depth D2.

10. The device of claim 9, wherein the first isolation region has a first width W1 and the third isolation region has a second width W2 extending from a side of the first fin active region to the second fin active region, wherein the first width W1 is greater than the second width W2.

11. The device of claim 9, further comprising a fourth isolation region formed in the semiconductor substrate proximate the second fin active region, the fourth isolation region having the second depth D2.

12. The device of claim 11, wherein the multi-fin transistor further includes a third fin active region and the fourth isolation region is disposed between the second fin active region and the third fin active region.

13. The device of claim 12, wherein a first width of the third isolation region extending form a side of the first fin active region to a side of the second fin active region is equal to a second width of the fourth isolation region extending from another side of the second fin active region to a side of the third fin active region.

14. A device comprising:
a transistor formed on a front side of a semiconductor substrate, the transistor having a first fin active region and a second fin active region;
a first isolation region formed in the semiconductor substrate on a first side of the multi-fin transistor, the first isolation region having a first depth D1 and a first width W1, wherein the semiconductor substrate has a first thickness that extends from the first isolation region at the first depth to a back side of the semiconductor substrate, wherein the back side of the semiconductor substrate is opposite the front side of the semiconductor substrate; and
a second isolation region formed in the semiconductor substrate between the first and second fin active regions, the second isolation region having a second depth D2 that is different than the first depth D1 and a second width W2 that is different than the first width W2, wherein the first depth D1 is at least two times greater than the second depth D2, wherein the semiconductor substrate has a second thickness that extends from the second isolation region at the second depth to the back side of the semiconductor substrate, wherein the second thickness of the semiconductor substrate is greater than the first thickness of the semiconductor substrate.

15. The device of claim 14, wherein the first width W1 is greater than the second width W2.

16. The device of claim 14, further comprising a third isolation region formed in the semiconductor substrate proximate the second fin active region, the third isolation region having the second width W2 and second depth D2.

17. The device of claim 16, wherein the transistor further includes a third fin active region, and
wherein the third isolation region is disposed between the second fin active region and the third fin active region.

18. The device of claim 14, further comprising a third isolation region formed in the semiconductor substrate on a second side of the transistor, the third isolation region having the first depth D1 and the first width W1.

19. The device of claim 14, wherein the second isolation region extends continuously from the first fin active region to the second fin active region, the entire second isolation region having the second depth D2 that is different than the first depth D1 and the second width W2 that is different than the first width W2.

20. The device of claim 14, wherein the first depth D1 is about four times greater than the second depth D2.

\* \* \* \* \*